United States Patent [19]
Yamamura et al.

[11] Patent Number: 6,166,937
[45] Date of Patent: *Dec. 26, 2000

[54] INVERTER DEVICE WITH COOLING ARRANGEMENT THEREFOR

[75] Inventors: Hirohisa Yamamura, Hitachioota; Osamu Suzuki, Chiyoda-machi; Akio Yasukawa, Kashiwa; Nobunori Matsudaira, Hitachi, all of Japan

[73] Assignee: Hitachi Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/315,817

[22] Filed: May 21, 1999

[30] Foreign Application Priority Data

Jun. 2, 1998 [JP] Japan ................................ 10-152898

[51] Int. Cl.[7] ................................ H02M 1/00; H05K 7/20
[52] U.S. Cl. ........................... 363/141; 363/146; 361/709
[58] Field of Search ..................................... 363/141, 144, 363/137, 146; 361/700, 709, 326, 388; 257/723, 724

[56] References Cited

U.S. PATENT DOCUMENTS 5,563,447 10/1996 Lake et al. .............................. 257/724
5,966,291 10/1999 Baumel et al. ......................... 361/707

FOREIGN PATENT DOCUMENTS 6-204370  7/1994  Japan .
7-194139  7/1995  Japan .
7-335798 12/1995  Japan .

Primary Examiner—Peter S. Wong
Assistant Examiner—Rajnikant B. Patel
Attorney, Agent, or Firm—Evenson, McKeown, Edwards & Lenahan, P.L.L.C.

[57] ABSTRACT

IGBT modules, bus bars and capacitors in an inverter main circuit are secured on the front face of a heat sink and at the back side of the heat sink a water cooling channel is formed to cool the IGBT modules. The bus bars and the capacitor, thereby the size of an inverter device used in an electric car is reduced and the duration thereof is prolonged.

1 Claim, 5 Drawing Sheets

INVERTER DEVICE WITH COOLING ARRANGEMENT THEREFOR

BACKGROUND OF THE INVENTION

1. Field of the Invention

The present invention relates to a small sized inverter device with a cooling arrangement therefor which is suitable for use in an electric motor vehicle, in particular, in an electric car.

2. Conventional Art

In an electric motor vehicle, in particular, an electric car, an inverter device which uses IGBTs (Insulated Gate Bipolar Transistor) as its semiconductor switching elements is broadly employed.

For this type of inverter device demands of size reduction and cost reduction are keen. In addition, in connection with reliability thereof guarantee of more than fifteen years duration is required.

For guaranteeing the duration of such inverter device it is important to suppress the temperature rise of its constituent parts by cooling thereof.

JP-A-7-335798(1995) discloses one of conventional arts relating to cooling of semiconductor devices in which its LSI packages are cooled with coolant.

Further, JP-A-6-204370(1994) discloses a cooling structure for semiconductor devices in which while using an aluminum heat sink processed into a hollow structure as its base, semiconductor elements having heat generating property are bonded thereon via an insulating sheet and a solder.

These conventional art coolings are effective for size reduction for such semiconductor devices, but ineffective for a large power use inverter device such as for electric cars which frequency repeat acceleration and deceleration, because the connection durability at the solder member is insufficient, and it is difficult to ensure the duration more than fifteen years.

SUMMARY OF THE INVENTION

Accordingly, an object of the present invention is to provide an inverter device which ensures a duration more than fifteen years for an inverter device such as used in an electric car being subjected to a frequent temperature variation as well as a heat cycle due to a large power cycle during its acceleration and deceleration.

More specifically, an object of the present invention is to provide an inverter device with a cooling arrangement which can realize the predetermined intended duration while achieving the size reduction requirement.

An inverter device is generally constituted by such as IGBT modules, capacitors, bus bars and a heat sink. Heat generated by an inverter device used for an electric car exceeds more than 1 W during acceleration and deceleration thereof, therefore, in order to satisfy the power cycle durability of such inverter device it is necessary to suppress the temperature rise due to the heat generated in the inverter device. Although the major source of the heat generation is from the IGBTs and the diodes, heat generated from the capacitors and the wiring conductors is also included. Therefore, it is necessary to cool the elements including the capacitors and the wiring conductors.

In order to reduce such temperature rise it is sufficient if the water cooling capacity is increased. However, it is required to limit the capacity of a cooling water circulating pump at about 60 W, therefore, the IGBTs and the diodes are constituted into modules in which the IGBT chips and the diode chips are soldered with a high temperature solder on an aluminum nitride insulating plate, and these modules are soldered with a low temperature solder onto a heat sink provided with fins to constitute a substrate direct cooling structure so as to significantly reduce heat radiation resistance from the IGBTs and the diodes and to enhance the cooling effect thereby.

DESCRIPTION OF THE PREFERRED EMBODIMENTS

Hereinbelow, embodiments according to the present invention will be explained with reference to the drawings attached.

Figure 1:
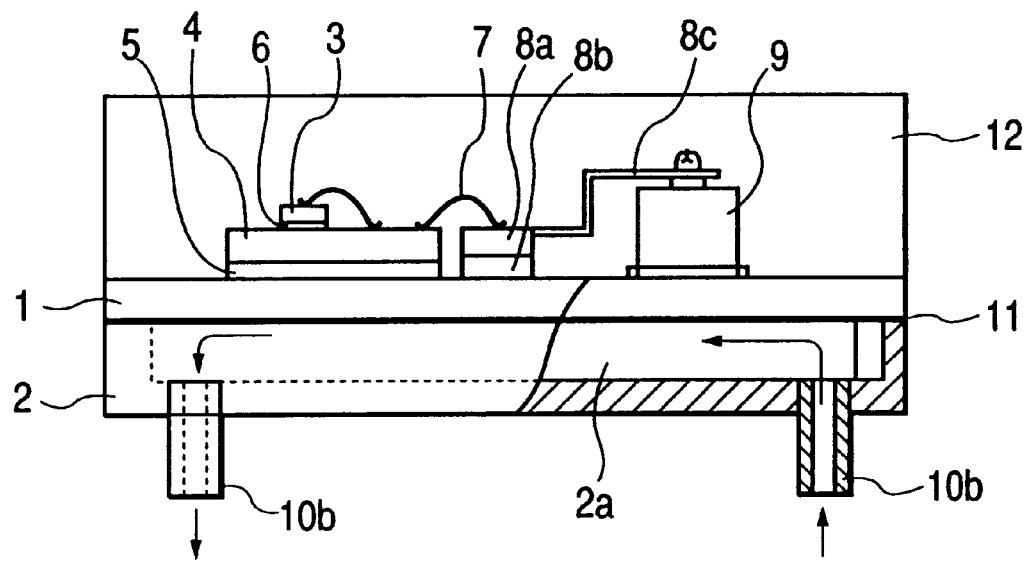
FIG. 1 is a vertically cross sectioned side view of an inverter device representing a first embodiment according to the present invention.

FIG. 1 is a side view of an inverter device representing a first embodiment according to the present invention. In the present inverter device, semiconductor switching modules are constituted by bonding semiconductor elements 3 such as IGBTs and diodes on one of the faces of an insulating substrate 4 having a good heat conductivity and of which both faces are provided with metalizing treatment with a high temperature solder forming a solder layer 6, and the other face of the insulating substrate 4 of the thus constituted semiconductor switching modules is bonded onto a heat sink 1 of such as copper base with a low temperature solder forming a solder layer 5.

A bus bar 8a serving as an electrical connecting member is bonded onto the heat sink 1 via an insulating member 8b. The electrical connection member 8a is connected to a patterned conductor formed on the surface of the insulating substrate 4 via aluminum wires 7 and as well as connected to a capacitor 9 via a bus bar 8c serving as an electrical connecting member.

A cover 12 surrounds the above indicated elements.

On the other hand, a recessed cooling water channel forming member 2 made of aluminum is combined with the heat sink 1 in water tight condition via a gasket 11 intervened between the bonding faces thereof, and at the back face side water channel 2a communicating water inlet and outlet ports 10a and 10b is constituted. The cooling water channel 2a is formed at the back side position of the heat sink 1 corresponding to the semiconductor elements 3, the electrical connection member 8a and the capacitor 9 disposed on the front side thereof, thereby, the cooling effect for the semiconductor elements 3, the electrical connection member 8a and the capacitor 9 can be sufficiently enhanced.

The cooling water channel forming member 2 made of aluminum is advantageous in view of cost reduction of the device, because the member can be produced more easily by die-casting or casting than with copper.

Figure 2:
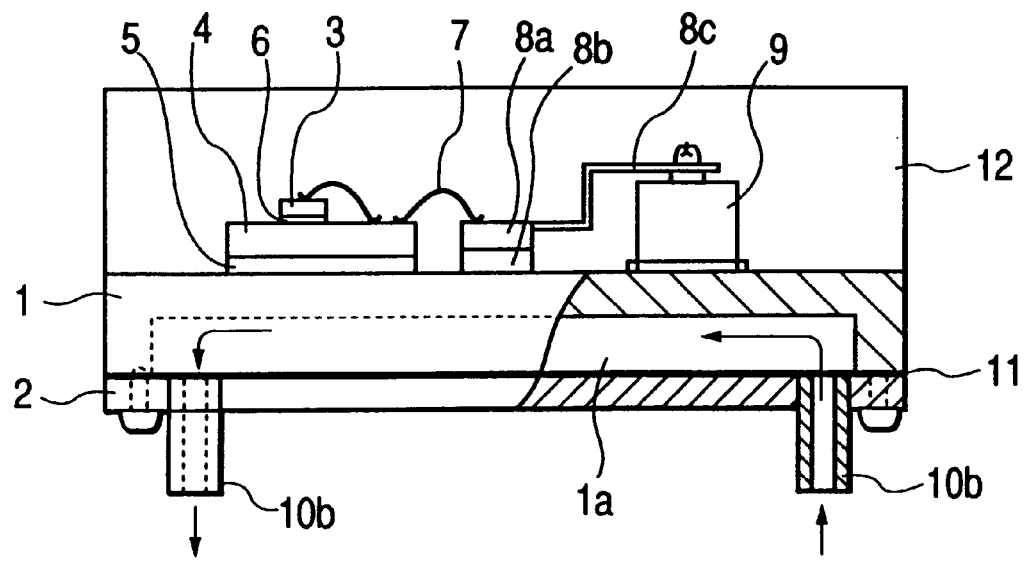
FIG. 2 is a vertically cross sectioned side view of an inverter device representing a second embodiment according to the present invention.

FIG. 2 is a view showing the second embodiment according to the present invention.

The difference of the present embodiment from the first embodiment illustrated in FIG. 1 is that a cooling water channel 1a is constituted by a recessed portion formed at the back side of the heat sink 1 and a flat cooling water channel forming member 2. Other constitutions of the present embodiment are substantially identical to the first embodiment, therefore the explanation of these constituents is omitted.

The heat sink 1 can be produced by die-casting either aluminum or copper. Further, an advantage can be achieved by realizing the cooling water channel forming member 2 by making use of a low cost member such as flat plate shaped resin, iron and aluminum.

Figure 3:
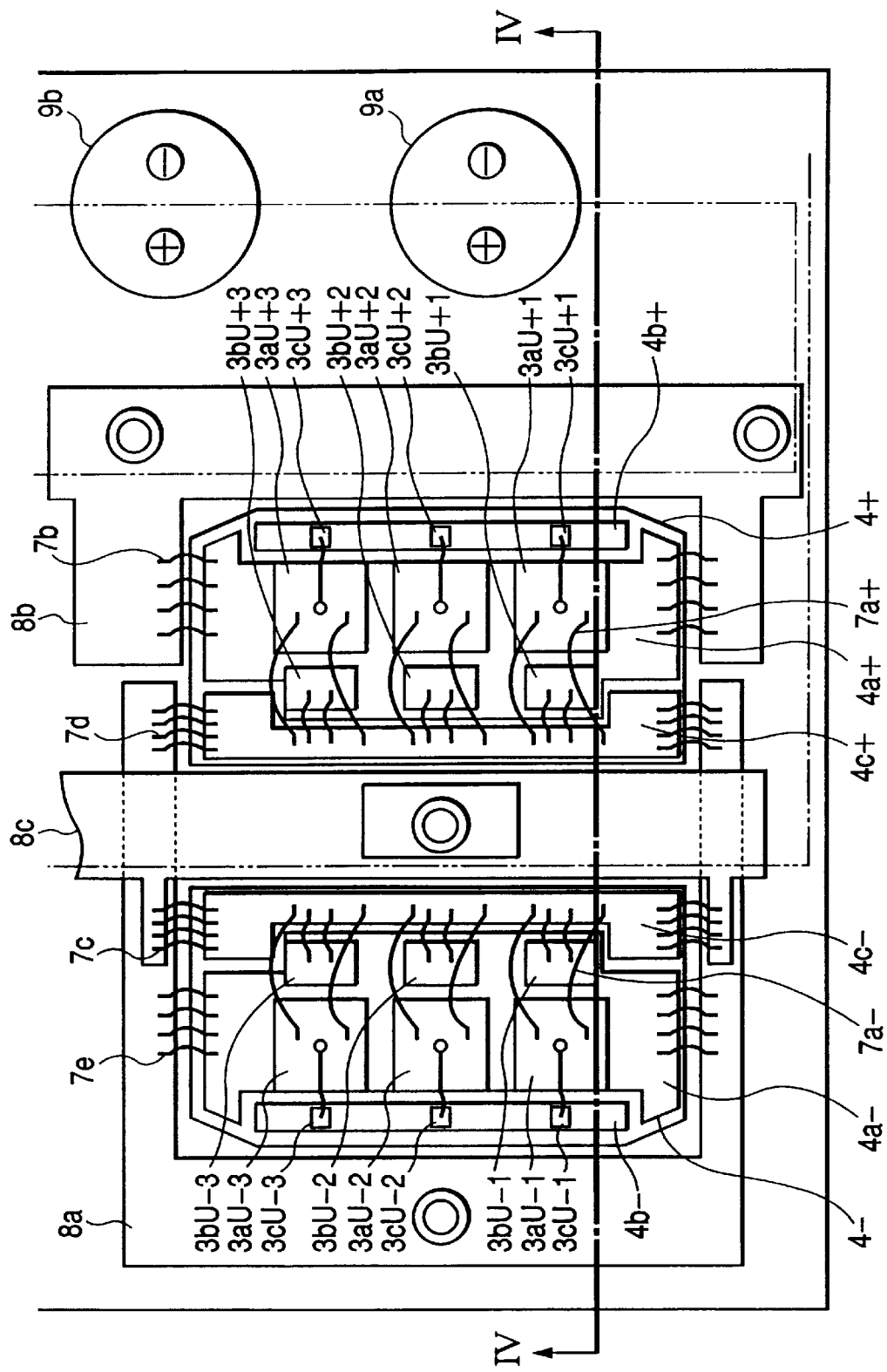
FIG. 3 is a plane view showing a mounting state of arm portions of one phase in a three phase inverter device for the inverter device representing third embodiment according to the present invention.
Figure 4:
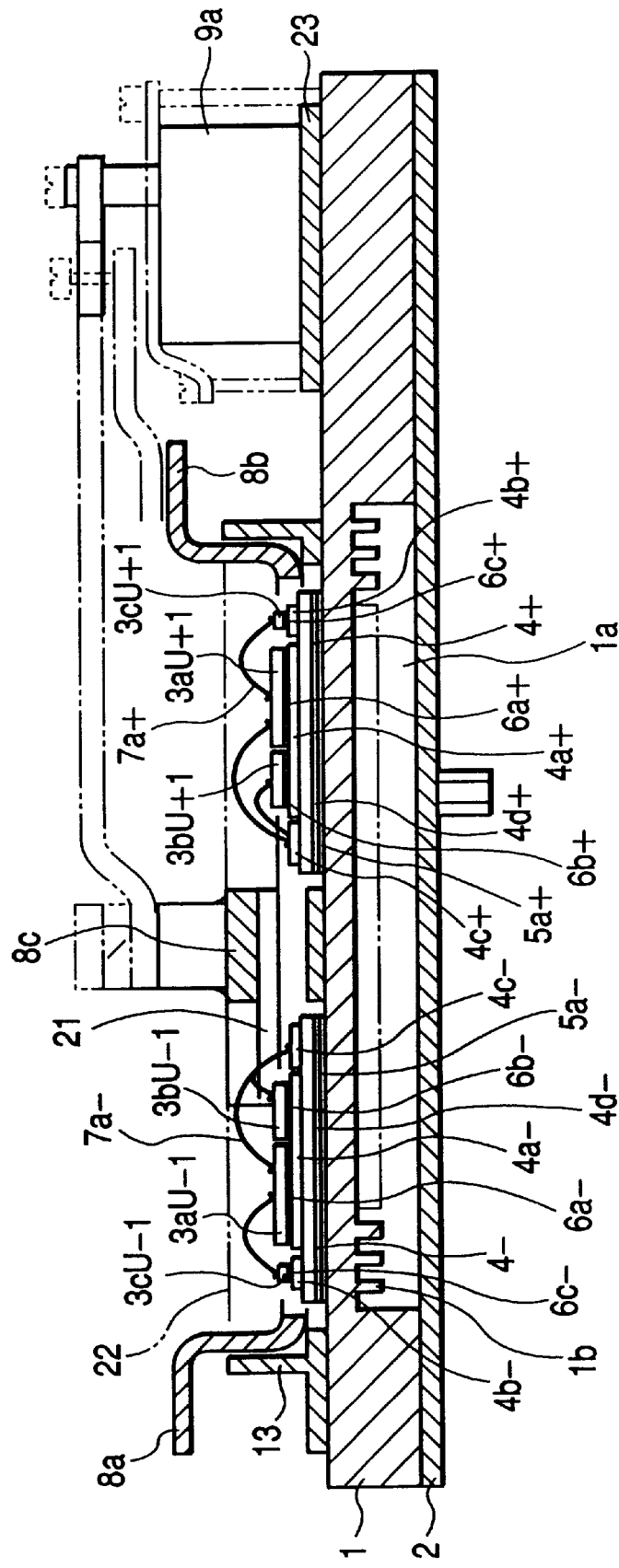
FIG. 4 is a cross sectional view taken along a line IV—IV in FIG. 3.
Figure 5:
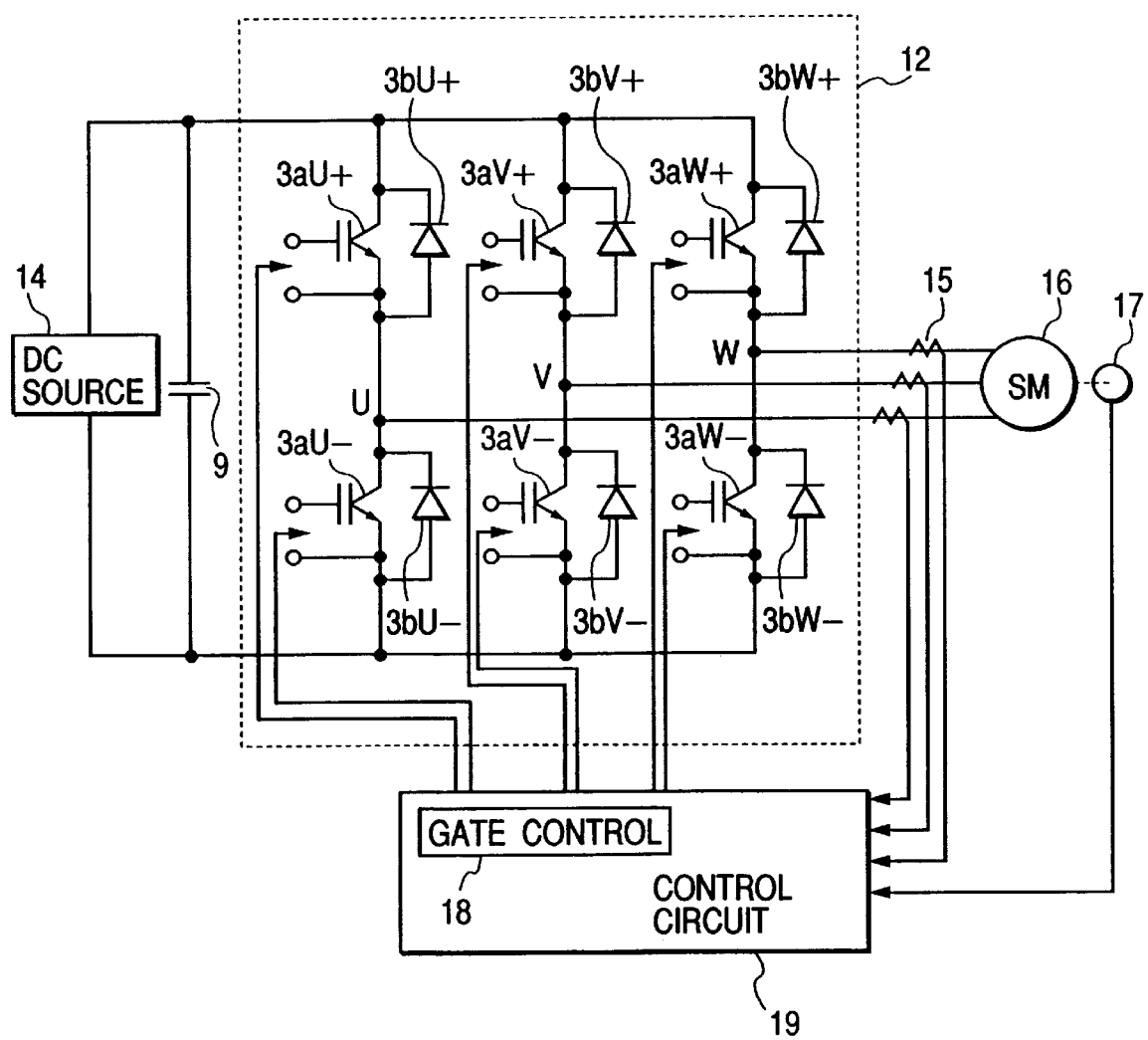
FIG. 5 is a circuit diagram of the inverter device representing the third embodiment according to the present invention.

FIGS. 3 through 6 show the third embodiment according to the present invention. As shown in FIG. 5, in the three phase inverter device according to the present embodiment, IGBTs 3aU+, 3aU−, 3aV+, 3aV−, 3aW+ and 3aW− and anti-parallel diodes 3bU+, 3bU−, 3bV+, 3bV−, 3bW+ and 3bW−, which form the constituent elements of the semiconductor switching element 3, constitute respective arms for the three phase bridge in an inverter main circuit 12 which receives an electric power from a DC power source 14 and the capacitor 9 and supplies the inverted electrical power to a motor 16. The IGBTs 3aU+, 3aU−, 3aV+, 3aV−, 3aW+ and 3aW− and the anti-parallel diodes 3bU+, 3bU−, 3bV+, 3bV−, 3bW+ and 3bW− are moduled every respective arms and are mounted. A microcomputer implemented control circuit 19 detects an output torque and a rotating speed of the motor 16 by making use of a current sensor 15 and an encoder 17, processes the same and PWM-controls the supply power to the motor by controlling a gate circuit 18 for the IGBTs 3aU+ through 3aW−. In the PWM control the carrier frequency is set at 10 kHz so that no inverter operation sounds cause noises.

When the semiconductor switching element 3 performs the switching operation at 10 kHz in such inverter device, the amount of switching loss of the semiconductor switching element increases comparable with the amount of usual on loss thereof, which increases the total amount of heat being generated as well as which further increases the importance of the cooling problem.

In an inverter device used for an electric car the above mentioned inverter losses including the switching loss and the on loss frequently reach up to 1 kW~2 kW, therefore, it was difficult to suppress the temperature at the internal junction portions of the IGBTs used in the semiconductor switching element below an allowable temperature level of Ti=150° C. by means of air cooling.

A cooling for suppressing the temperature at the internal junction portions of the IGBTs below the allowable temperature level can be realized comparatively easily by means of water cooling. However, in order to guarantee the required duration more than fifteen years of the soldered connection portions, it is necessary to reduce the total heat transfer resistance of the heat radiation path from the IGBTs, the insulating body and the heat sink to the cooling water and as well as it is necessary to take into account the reliability problem inherent to the IGBT modules of the electrical connection portions such as wire bonding portions and solder connected portions between an insulator substrate and a base substrate under semiconductor chips which are subjected to bonding strength reducing repeating thermal stress due to temperature rise of the semiconductor chips caused by a large current flowing therethrough.

FIGS. 3 and 4 show a mounting structure of the IGBTs 3aU+ and 3aU−, the anti-parallel diodes 3bU+ and 3bU− and the capacitors 9a and 9b on the heat sink 1 which constitute two arms for U phase in the bridge for the inverter main circuit 12 in the inverter device representing the third embodiment. The mounting structures of other constituent parts for the V and W phases are identical to those for the U phase, therefore, the illustration thereof is omitted.

In the present embodiment, each of the IGBTs 3aU+ and 3aU− and the anti-parallel diodes 3bU+ and 3bU− is respectively constituted by a parallel circuit of three IGBT chips 3aU+1, 3aU+2 and 3aU+3, another parallel circuit of three IGBT chips 3aU−1, 3aU−1 and 3aU−3, a parallel circuit of three anti-parallel diode chips 3bU+1, 3bU+2 and 3bU+3, and another parallel circuit of three anti-parallel diode chips 3bU−1, 3bU−2 and 3bU−3.

One semiconductor switching module for + side arm with the IGBT chips 3aU+1, 3aU+2 and 3aU+3 and the anti-parallel diodes 3bU+1, 3bU+2 and 3bU+3 is constituted by securing these semiconductor chips by bonding on the upper face of a common electrode pattern 4a+ of an insulating substrate 4+ of aluminum nitride on which both faces a copper pattern is formed via a high temperature solders 6a+ and 6b+, by securing gate resistance chips 3cU+1, 3cU+2 and 3cU+3 on a gate electrode pattern 4b+ via a high temperature solder 6c+ and by connecting between chips and a wiring pattern 4c+ through bonding the both ends of aluminum wires 7a+.

Another semiconductor switching module for—side arm with the IGBT chips 3aU−1, 3aU−2 and 3aU−3 and the anti-parallel diodes 3bU−1, 3bU−2 and 3bU−3 is constituted by securing these semiconductor chips by bonding on the upper face of a common electrode pattern 4a− of an insulating substrate 4− of aluminum nitride on which both faces a copper pattern is formed via a high temperature solders 6a− and 6b−, by securing gate resistance chips 3cU−1, 3cU−2 and 3cU−3 on a gate electrode pattern 4b− via a high temperature solder 6c− and by connecting between chips and a wiring pattern 4c− through bonding the both ends of aluminum wires 7a−.

These semiconductor switching modules are inspected by their arm units.

The thus constituted two semiconductor switching modules are secured by bonding copper patterns 4d+ and 4d− on the bottom face of the aluminum nitride insulating substrates 4+ and 4− onto the copper made heat sink 1 via low temperature solders 5a and 5b.

A U phase output bus bar 8a and a + power feeding bus bar 8b are disposed by bonding onto the heat sink 1 via an aluminum nitride insulating plate (not shown) so as to locate around the semiconductor switching modules. Further, a − power feeding bus bar 8c is disposed by bonding onto the output bus bar 8a via an insulating plate 21.

The + power feeding bus bar 8b is connected to the common electrode pattern 4a+ through bonding of aluminum wires 7b, the − power feeding bus bar 8c is connected to the wiring pattern 4c− through bonding of aluminum wires 7c and the output bus bar 8a is connected to the wiring pattern 4c+ and the common electrode pattern 4a− through bonding of aluminum wires 7d and 7e.

A resin frame 13 is bonded to the heat sink 1 so as to surround these elements such as the IGBT chips 3a, anti-parallel diode 3b, aluminum nitride insulating substrate 4 and bus bars 8a~8c, and inside thereof gel 22 is injected so as to bury and protect these constituent elements.

The capacitor 9 is constituted by connecting a plurality of capacitors 9a and 9b in parallel, the respective capacitors 9a and 9b are secured by bonding onto the heat sink 1 via an aluminum nitride insulating plate 23 and are further connected to the bus bars 8b and 8c.

The recess for forming the cooling water channel 1a along the back face of the heat sink 1 is formed so as to cover the back sides of the areas where the aluminum nitride insulating substrates 4+ and 4− for the semiconductor switching modules representing major heat generating elements and the bus bars 8a through 8c are bonded, and at the heat exchanging surface inside the recess fins 1b having 1 mm through 6 mm pitch irregularity are formed so as to increase heat exchange or heat radiation efficiency.

The heat generated from the respective elements at respective moments is transferred to the heat sink 1 and is water-cooled. In particular, the largest amount of heat generated by the IGBT chips 3aU+1 through 3aU−3 is transferred to the aluminum nitride insulating substrates 4+ and 4− via the layers of the high temperature solders 6a+ and 6a−, further transferred to the heat sink 1 via the layers of the low temperature solders 5a+ and 5a−, and is radiated into the cooling water from the heat exchanging surface provided with the fins 16. Accordingly, for the area being subjected to a large amount of heat the heat radiation or the cooling efficiency is kept high and an excess temperature rise of the elements and the solder layers on such area can is suppressed to ensure the predetermined duration of the device.

Figure 6:
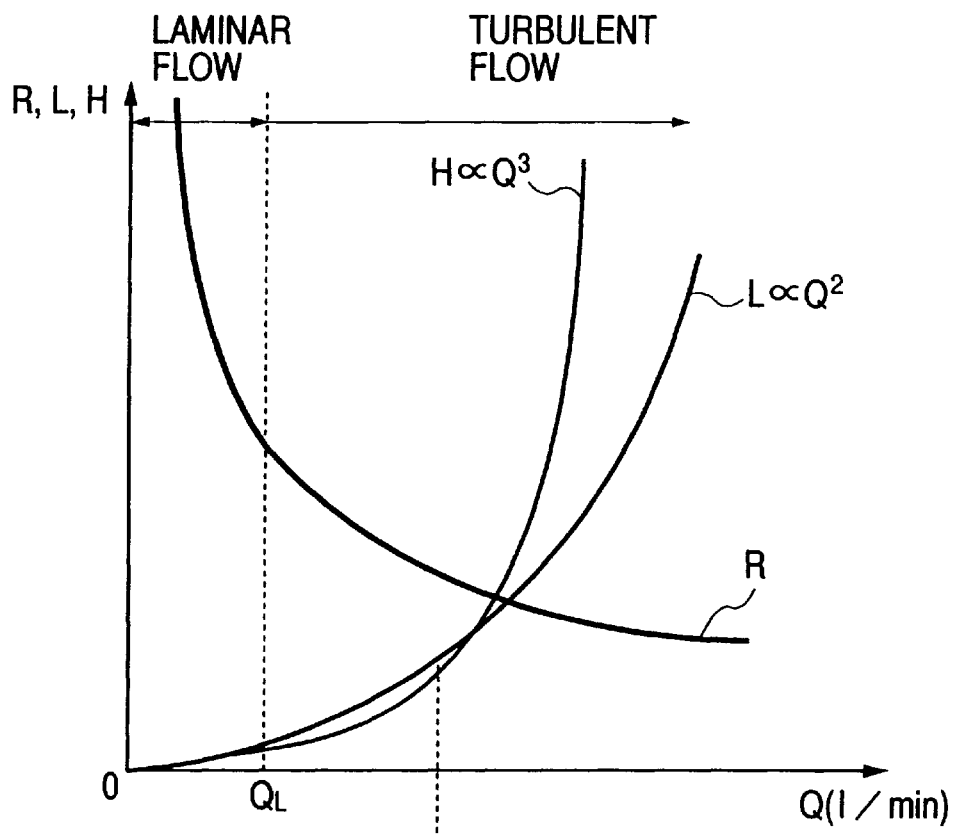
FIG. 6 is a cooling characteristic diagram of the inverter devices according to the present invention.
Figure 6:
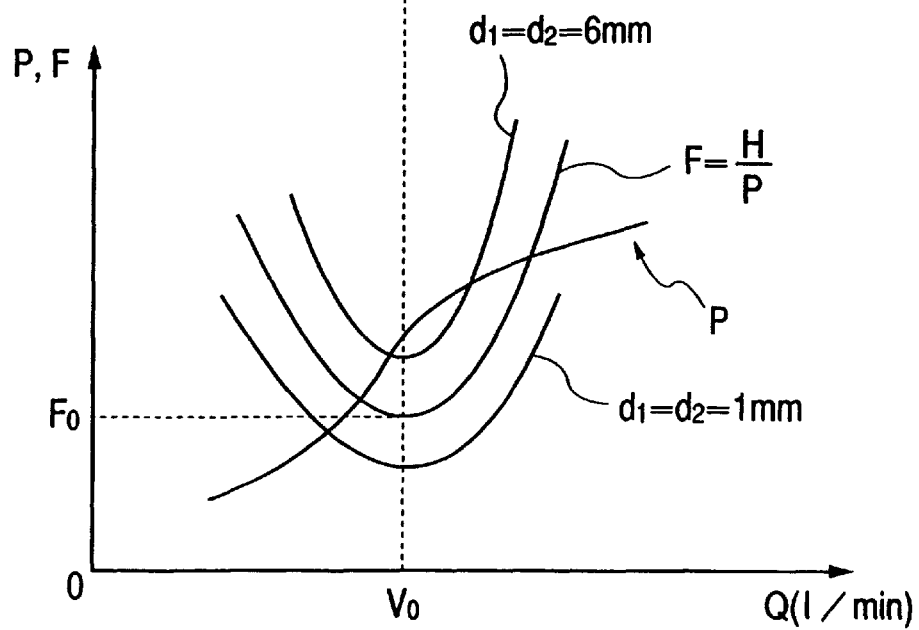

With regard to the water cooling effect it was ascertained by experiments that both the optimum height of the water channel and the optimum pitch of the fins 1b formed at the back face of the heat sink 1 where the semiconductor switching modules or the IGBTs are bonded are respectively between 1 mm and 6 mm. Namely, by making use of pressure loss H, power consumption L (W) of the cooling water pump and inverter output P (W) with respect to flow rate Q (1/min) as illustrated in FIG. 6, an evaluation function F=H/P of which minimum value represents a maximum inverter output with a minimum pressure loss is determined and further assuming that the pressure loss H is proportional to the third power of the flow rate Q and the inverter output P is determined by heat transfer resistance R and allowable value of temperature rise, it is observed that an optimum point of the inverter output is in a certain flow rate range. Further, an evaluation function F with regard to a trough width d1 and a crest width d2 of the fins is determined, it is observed that there exists an optimum range with regard to a target value F0 which is determined at a point when the pressure loss H decreases below the capacity of a water cooling pump used under a predetermined inverter output P.

V0 in FIG. 6 denotes a flow rate at which a minimum value of the evaluation function F is given, therefore, when a determined value of the evaluation function F is below F0, a maximum inverter output P is obtained at the flow rate V0, even if somewhat substantial pressure loss is observed.

Even when the area of the heat sink 1 where the capacitors 9a and 9b are disposed is structured in a flat plate as illustrated, a predetermined cooling effect can be obtained, thereby a pressure loss caused by a possible water channel can be reduced.

Examples of preferable materials of the heat sink 1 are aluminum, copper and AlSiC.

According to the present invention, the semiconductor switching modules as well as other constituent elements such as bus bars and capacitors in the inverter device can be efficiently cooled, thereby advantages of reducing the size of the device and of prolonging the duration of the device are achieved.

What is claimed is:

1. A three phase inverter device, comprising:

a plurality of semiconductor switching modules, each formed by mounting an IGBT chip and an anti-parallel diode chip connected in parallel with said IGBT chip on an aluminum nitride insulating substrate through a high temperature solder which constitutes either a positive side arm or a negative side arm for respective phases;

a plurality of bus bars, each serving to connect a corresponding one of said semiconductor switching modules to either a power source or a load and being positioned around the corresponding one of said semiconductor switching modules;

a capacitor being connected between the input bus bars from the power source; and a heat sink made of a material selected from one of aluminum, copper and AlSic, and having a first major surface and a second major surface, said heat sink mounting on the first major surface said semiconductor switching modules through a low temperature solder, said bus bars and said capacitor through an aluminum nitride insulating substrate, the second major surface of said heat sink, corresponding to a portion of the first major surface where said semiconductor switching modules and said bus bars are mounted other than a portion where said capacitor is mounted, is used for forming a water cooling channel for said heat sink, and a plurality of cooling fins with a pitch in a range from 1 mm to 6 mm being provided on the second major surface of said heat sink in the water cooling channel.

* * * * *